(12) United States Patent
Miyahara et al.

(10) Patent No.: US 12,112,947 B2
(45) Date of Patent: *Oct. 8, 2024

(54) METHOD OF CRYSTALLIZING AMORPHOUS SILICON FILM AND DEPOSITION APPARATUS

(71) Applicant: Tokyo Electron Limited, Tokyo (JP)

(72) Inventors: Tatsuya Miyahara, Yamanashi (JP);
Daisuke Suzuki, Yamanashi (JP);
Yoshihiro Takezawa, Yamanashi (JP);
Yuki Tanabe, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 176 days.

This patent is subject to a terminal disclaimer.

(21) Appl. No.: 17/655,247

(22) Filed: Mar. 17, 2022

(65) Prior Publication Data

US 2022/0319846 A1 Oct. 6, 2022

(30) Foreign Application Priority Data

Apr. 6, 2021 (JP) .................................. 2021-064988

(51) Int. Cl.
*H01L 21/02* (2006.01)
*C23C 16/02* (2006.01)
*C23C 16/24* (2006.01)
*C23C 16/52* (2006.01)
*C23C 16/56* (2006.01)

(52) U.S. Cl.
CPC .... *H01L 21/02667* (2013.01); *C23C 16/0272* (2013.01); *C23C 16/24* (2013.01); *C23C 16/52* (2013.01); *C23C 16/56* (2013.01); *H01L 21/02532* (2013.01); *H01L 21/02592* (2013.01); *H01L 21/0262* (2013.01); *H01L 21/02645* (2013.01)

(58) Field of Classification Search
None
See application file for complete search history.

(56) References Cited

U.S. PATENT DOCUMENTS

| | | | | |
|---|---|---|---|---|
| 5,723,887 A | * | 3/1998 | Tsuchimoto | ............ H01L 28/84 257/E21.013 |
| 6,146,966 A | * | 11/2000 | Hirota | ..................... H01L 28/84 438/398 |
| 2006/0186415 A1 | * | 8/2006 | Asano | ................. H01L 27/1281 257/72 |

FOREIGN PATENT DOCUMENTS

| | | | | |
|---|---|---|---|---|
| JP | 4376979 B2 | * | 12/2009 | ......... H01L 21/2022 |
| JP | 2011187609 | * | 9/2011 | |
| JP | 2011216759 | * | 10/2011 | |
| JP | 2015-045082 | | 3/2015 | |

* cited by examiner

*Primary Examiner* — Mandy C Louie
(74) *Attorney, Agent, or Firm* — IPUSA, PLLC

(57) ABSTRACT

A method of crystallizing an amorphous silicon film includes depositing the amorphous silicon film on a seed layer formed over a substrate while heating the amorphous silicon film at a first temperature, and forming a crystal nucleus in an outer layer of the amorphous silicon film by causing migration of silicon in the outer layer by heating the amorphous silicon film at a second temperature higher than the first temperature.

11 Claims, 10 Drawing Sheets

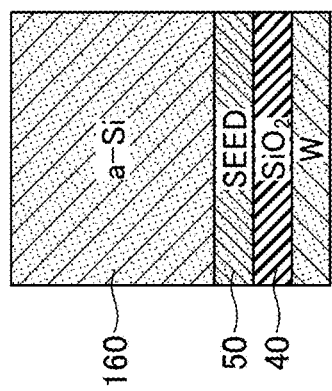
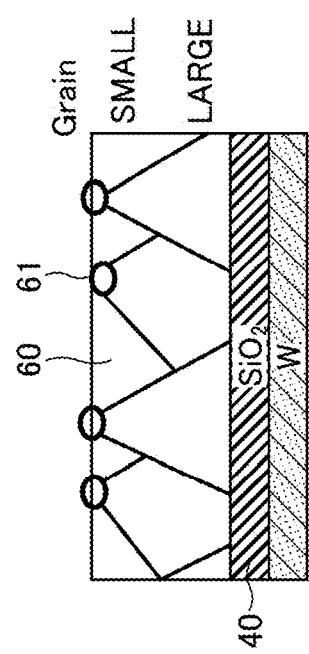
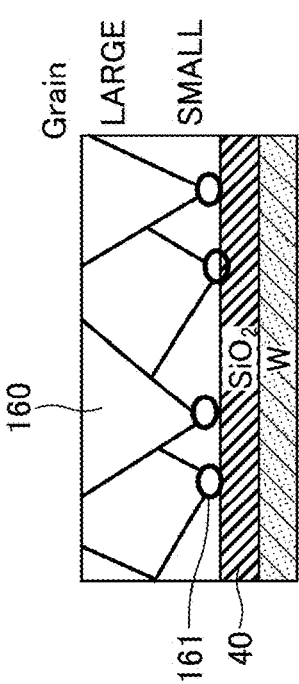

| | Condition | Structure | SURFACE −x50 | SURFACE −x100 | CROSS-SECTION −x200 |
|---|---|---|---|---|---|
| (a) | 550°C a-Si Depo 1000 A ⇒ Si Migration did not occur | 550°C a-Si 1000 A / SiO₂ | | | |
| (b) | 560°C a-Si Depo 1000 A ⇒ Si Migration occurred | 560°C a-Si 1000 A / SiO₂ | | | |
| (c) | 570°C a-Si Depo 1000 A ⇒ Si Migration occurred | 570°C a-Si 1000 A / SiO₂ | | | |
| (d) | 580°C a-Si Depo 1000 A ⇒ Si Migration occurred | 580°C a-Si 1000 A / SiO₂ | | | |

METHOD OF CRYSTALLIZING AMORPHOUS SILICON FILM AND DEPOSITION APPARATUS

CROSS-REFERENCE TO RELATED APPLICATION

The present application is based on and claims priority to Japanese Priority Application No. 2021-064988 filed on Apr. 6, 2021, the entire contents of which are hereby incorporated herein by reference.

BACKGROUND OF THE INVENTION

1. Field of the Invention

The present disclosure relates to a method of crystallizing an amorphous silicon film and a deposition apparatus.

2. Description of the Related Art

For example, Japanese Laid-Open Patent Application Publication No. 2015-45082 discloses a conventional method of depositing a silicon film, including a step of forming a seed layer by supplying amino silane-based gas to a surface to be treated and a step of forming a silicon film by supplying, to the seed layer, silane-based gas that does not include any amino group, wherein a process temperature in the step of forming the seed layer is in a temperature range that is equal to or less than 350° C. and that is equal to or more than room temperature (25° C.)

SUMMARY OF THE INVENTION

An embodiment of the present disclosure provides a method of crystallizing an amorphous silicon film that includes depositing the amorphous silicon film on a seed layer formed over a substrate while heating the amorphous silicon film at a first temperature, and forming a crystal nucleus in an outer layer of the amorphous silicon film by causing migration of silicon in the outer layer by heating the amorphous silicon film at a second temperature higher than the first temperature.

BRIEF DESCRIPTION OF THE DRAWINGS

FIGS. 2A to 2C are drawings illustrating an example of a conventional method of crystallizing an amorphous silicon and a method of crystallizing an amorphous silicon according to an embodiment of the present invention;

FIG. 9 is a figure for comparing cross-sectional structures of an example according to a property B and an example according to a property C illustrated in FIG. 8; and FIG. 10 is a figure illustrating an implementation result of the example according to the property B with a change in temperature in the step for forming a high-temperature amorphous silicon film.

DETAILED DESCRIPTION OF THE PREFERRED EMBODIMENTS

It is desired to provide a method of crystallizing an amorphous silicon film and a deposition apparatus configured to form crystal nuclei by aggregating silicon in an outer layer of an accumulated amorphous silicon film and crystallizing the amorphous silicon.

Hereinafter, embodiments for carrying out the present invention will be described with reference to the drawings.

Figure 1:
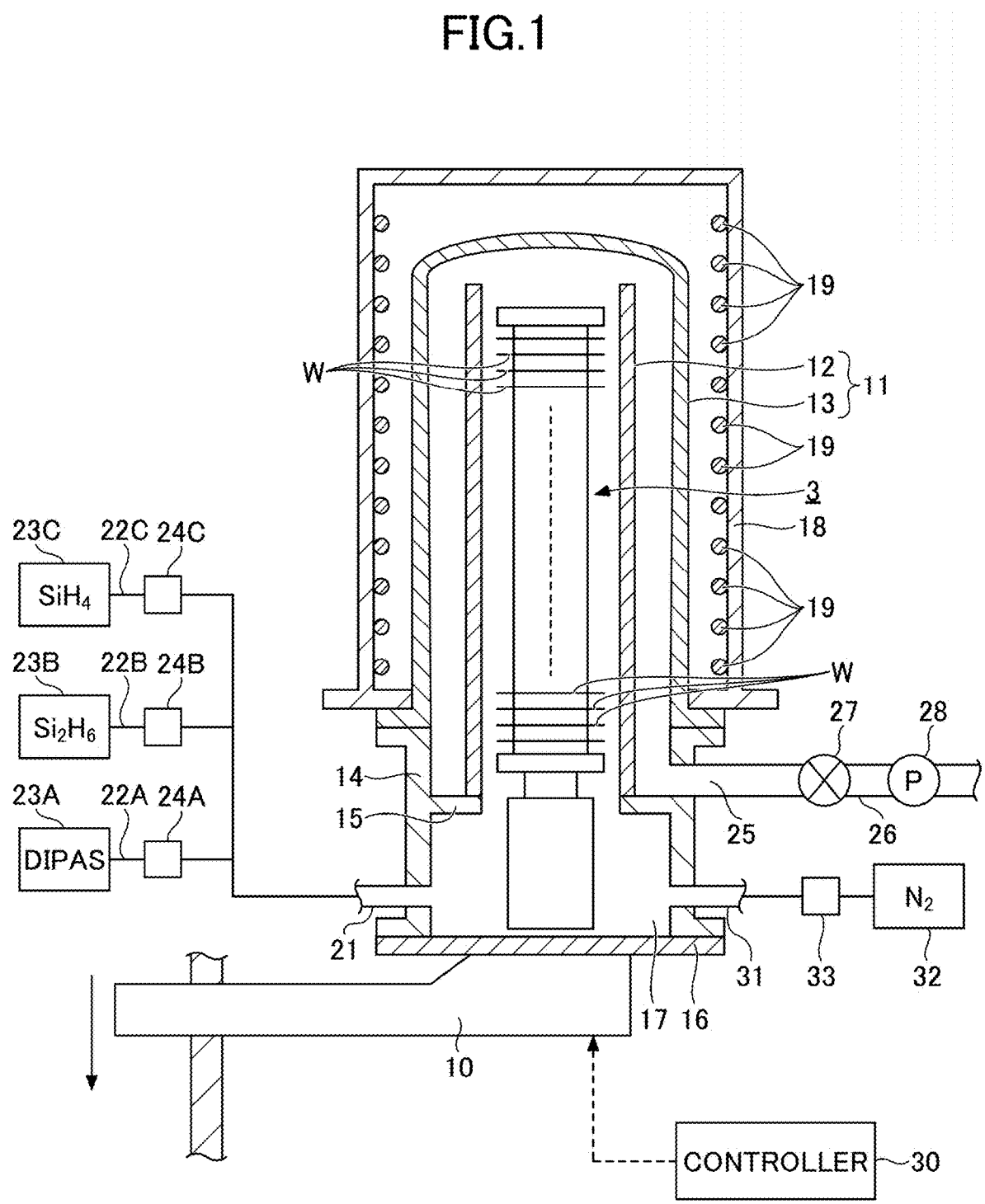
FIG. 1 is a drawing illustrating a deposition apparatus according to an embodiment of the present disclosure.

FIG. 1 is a drawing illustrating a deposition apparatus according to an embodiment of the present disclosure. In the present embodiment, an example in which the deposition apparatus is configured as a vertical thermal process apparatus will be described. Incidentally, the deposition apparatus according to the present disclosure is not limited to the vertical thermal process apparatus, and may be applied to a variety of deposition apparatuses that can perform deposition. Applicable deposition apparatuses also include a single-wafer deposition apparatus and a semi-batch deposition apparatus. In the present embodiment, an example in which the deposition apparatus is configured as a vertical thermal process apparatus will be described.

The vertical thermal process apparatus performs a CVD process in order to form a crystallized silicon film on a wafer W, i.e., a substrate. Specifically, a deposition process is performed on the wafer W. This deposition process is performed with thermal chemical vapor deposition (CVD).

The vertical heat processing apparatus includes a reactor tube 11 that is an approximately cylindrical vacuum chamber and the longitudinal direction thereof is oriented to the vertical direction. The reactor tube 11 has a dual tube structure including an inner tube 12, and an outer tube 13 with a ceiling formed so as to cover the inner tube 12 and to have a constant distance from the inner tube 12. The inner tube 12 and the outer tube 13 are formed of a heat resistant material such as quartz. The reactor tube 11 forms a closed space for treating the substrate and may therefore be referred to as a process chamber.

A manifold 14 made of stainless steel (SUS) formed into a cylindrical shape is disposed below the outer tube 13. The manifold 14 is hermetically connected to the lower end of the outer tube 13. The inner tube 12 protrudes from the inner wall of the manifold 14 and is supported by a support ring 15 integrally formed with the manifold 14.

A lid 16 is disposed below the manifold 14, and a boat elevator 10 allows the lid 16 to be moved up and down between an elevated position and a lowered position. FIG. 1 illustrates the lid 16 located in the elevated position, where the lid 16 closes an opening 17 of the reactor tube 11 below the manifold 14 to seal the inside of the reactor tube 11. The lid 16 includes a wafer boat 3 made of, for example, quartz. The wafer boat 3 is configured to horizontally hold a number of wafers W to be processed as substrates in a stacked manner at a predetermined vertical distance. Around the reactor tube 11, an insulator 18 is disposed to surround the reactor tube 11, and an inner wall thereof has a heater 19 made of a resistance heating element, which is, for example, a heating part, so that the inside of the reactor tube 11 can be heated.

At the manifold 14, below the support ring 15 described above, a process gas inlet tube 21 and a purge gas inlet tube 31 are inserted, and the downstream end of each gas inlet tube 21, 31 is arranged so as to supply a gas to the wafer W within the inner tube 12. For example, the upstream side of the process gas inlet tube 21 branches to form branches 22A to 22C, and each upstream end of the branches 22A to 22C is connected to a supply source 23A of diisopropylaminosilane (DIPAS) gas, a supply source 23B of disilane ($Si_2H_6$) gas, and a supply source 23C of monoaminosilane ($SiH_4$) gas. The branches 22A to 22C include gas supply mechanisms 24A to 24C, respectively. The gas supply mechanisms 24A to 24C each include valves and mass flow controllers configured to control the flow rate of the process gas supplied from the gas supply sources 23A to 23C to the process gas inlet tube 21, respectively.

DIPAS gas is a gas for forming a seed layer to form a first seed layer on a surface of a silicon oxide film formed on a surface of the wafer W, and the gas supply source 23A and the gas supply mechanism 24A constitute a DIPAS gas supply part.

$Si_2H_6$ gas is a gas for forming a second seed layer on the surface of the first seed layer, and the gas supply source 23B and the gas supply mechanism 24B constitute a $Si_2H_6$ (disilane) gas supply part.

Also, $Si_2H_6$ gas may be used as a silicon-containing gas to further deposit an amorphous silicon film on the second seed layer. Details are described below.

DIPAS gas supply part and the disilane gas supply part are gas supply parts for forming the seed layer, and thus may be referred to as a seed layer forming gas supply part.

In the present embodiment, two types of gases for forming the seed layer are described, but a single type of gas for forming the seed layer may be used. In addition, when the film is formed on the wafer W on which the seed layer is already formed, the seed layer forming gas supply part may not be disposed. In addition, gases other than DIPAS gas and $Si_2H_6$ gas may be used, even if a seed layer forming gas supply part is used. Thus, the DIPAS gas supply part, the disilane gas supply part, and the seed layer forming gas supply part may be provided as necessary.

$SiH_4$ gas is a deposition gas for depositing an amorphous silicon (Si) film on the wafer W on which the seed layer is formed, and the gas supply source 23C and the gas supply mechanism 24C constitute a silane gas supply part. Because the silane is a gas used for depositing the amorphous silicon film, the silane gas supply part may be referred to as a film deposition gas supply part.

The upstream side of the purge gas inlet tube 31 is connected to a supply source 32 of nitrogen ($N_2$) gas, which is a purge gas. A gas supply mechanism 33 is disposed in the purge gas inlet tube 31. The gas supply mechanism 33 is configured similar to the gas supply mechanisms 24A to 24E to control a flow rate of the purge gas downstream of the inlet tube 31.

In the manifold 14, an exhaust port 25 opens in a lateral surface of the support ring 15, and an exhaust gas generated in the inner tube 12 passes through a space formed between the inner tube 12 and the outer tube 13 and is exhausted to the exhaust port 25. An exhaust pipe 26 is hermetically connected to the exhaust port 25. A valve 27 and a vacuum pump 28 are disposed in this order from an upstream side of the exhaust pipe 26. By adjusting the opening of the valve 27, the pressure in the reactor tube 11 is controlled to the desired pressure.

The vertical heat processing apparatus includes a controller 30 that is constituted of a computer, and the controller 30 includes a program. In this program, a group of steps is configured so that a control signal can be output to each part of the vertical heat processing apparatus 1 to control the operation of each part so that a series of processing operations described below can be performed on the wafer W. Specifically, a control signal is output to control the elevation of the lid 16 by the boat elevator 10, the output of the heater 19 (that is, the temperature of the wafer W), the opening of the valve 27, and the flow rate of each gas into the reactor tube 11 by the gas supply mechanisms 24A to 24C, and 33. The program is stored in a storage medium such as a hard disk, a flexible disk, a compact disk, a magneto optical disk (MO), a memory card, or the like in the controller 30.

Although the details are explained later, the controller 30 also performs a control to set the heater 19 to temperature settings that are different between deposition of an amorphous silicon film and formation of crystal nuclei.

FIGS. 2A to 2C are drawings illustrating an example of a conventional method of crystallizing an amorphous silicon and a method of crystallizing an amorphous silicon according to the present embodiment.

FIG. 2A is a drawing illustrating a conventional method of crystallizing an amorphous silicon film. FIG. 2B is a drawing illustrating an example of an amorphous silicon film 60 deposited by a deposition method of an amorphous silicon film according to the present embodiment. As illustrated in FIG. 2A, in the conventional crystallization of the amorphous silicon film, crystal nuclei are formed from a bottom surface of $SiO_2$ in the base layer, and thereafter, a crystal is grown from the crystal nuclei of the bottom surface (a crystal is grown in a direction from the bottom surface to the top surface).

In contrast, as illustrated in FIG. 2B, in the deposition method of the amorphous silicon film according to the present embodiment, crystal nuclei 61 are formed on the top surface side, and the crystal nuclei 61 are grown from the top surface to the bottom surface side. Specifically, as illustrated in FIG. 2B, the amorphous silicon film 60 deposited by the deposition method of the amorphous silicon film according to the present embodiment includes the crystal nuclei 61 in the outer layer. Specifically, a migration occurs in the outer layer of the amorphous silicon film 60, and accordingly, the crystal nuclei 61 are formed. Then, the crystallization is advanced from the outer layer, in which the crystal nuclei 61 are present, to the bottom portion.

FIG. 2C is a drawing illustrating an amorphous silicon film formed by a conventional crystallization method. A seed layer 50 is formed on a silicon oxide film 40, and an amorphous silicon film 160 is formed on the seed layer 50. Thereafter, the wafer W is heated, so that crystal nuclei 161 are formed around the silicon oxide film 40.

Figure 3:
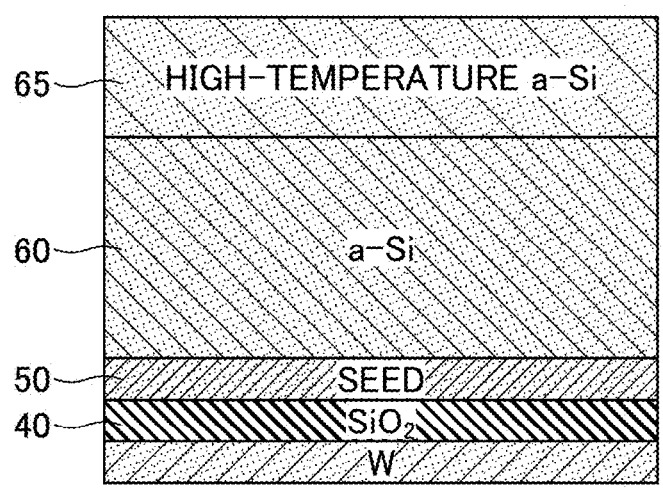
FIG. 3 is a drawing illustrating an example of a cross-sectional configuration of a method of crystallizing an amorphous silicon film according to the present embodiment.

FIG. 3 is a drawing illustrating an example of a cross-sectional configuration of a method of crystallizing an amorphous silicon film according to the present embodiment. As illustrated in FIG. 3, a silicon oxide film 40 and the seed layer 50 are formed on the wafer W, and an amorphous silicon film 60 is formed on the seed layer 50. Also, a high-temperature amorphous silicon film 65 is formed on the outer layer of the amorphous silicon film 60. The high-temperature amorphous silicon film 65 is an amorphous silicon film formed in a temperature range higher than for the amorphous silicon film 60, and has a film property different from the amorphous silicon film 60 on the seed layer 50. The high-temperature amorphous silicon film 65 is an amorphous silicon film in which crystal nuclei are formed.

In this manner, in the method of crystallizing the amorphous silicon film according to the present embodiment, the high-temperature amorphous silicon film 65 that is different in the film property is formed on the outer layer of the amorphous silicon film 60 to achieve formation of crystal nuclei in the outer layer and growth of crystal from the outer layer.

FIGS. 4A to 4D are drawings illustrating an example of a method of crystallizing an amorphous silicon film according to a first embodiment of the present disclosure.

Figure 4:
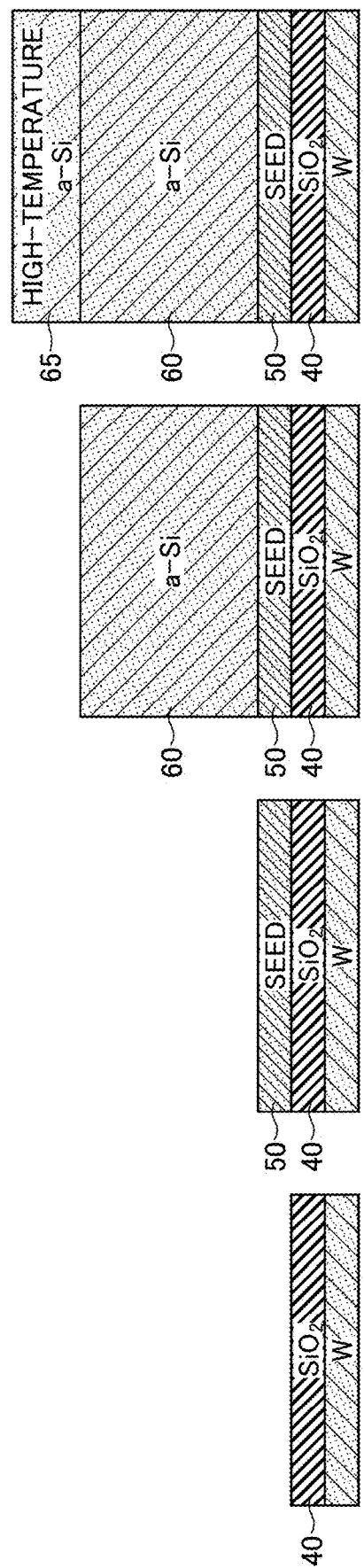
FIGS. 4A to 4D are drawings illustrating an example of a method of crystallizing an amorphous silicon film according to a first embodiment of the present disclosure.

FIG. 4A is a drawing illustrating an example of a substrate introduction step, and illustrates a cross-sectional configuration of the wafer W in an initial state.

First, the wafer W illustrated in FIG. 4A is conveyed and held by a conveying mechanism, not illustrated, to the wafer boat 3. Therefore, the wafer boat 3 is placed on the lid 16 located at the lowered position. Then, the lid 16 moves upward to the elevated position, the wafer boat 3 is conveyed into the reactor tube 11, the opening 17 of the reactor tube 11 is closed by the lid 16, and the inside of the reactor tube 11 is sealed. Next, purge gas is supplied into the reactor tube 11 and the inside of the reactor tube 11 is evacuated to form a vacuum atmosphere with a predicted pressure. Also, the wafer W is heated to a predetermined temperature by the heater 19. At this occasion, the temperature is set to a predetermined deposition temperature that is preferable for depositing a silicon film on the wafer W. The temperature control of the heater 19 may be performed by the controller 30.

FIG. 4B illustrates an example of a seed layer forming step.

After the wafer W is heated, the purge gas supply is stopped and DIPAS gas is supplied into the reactor tube 11. DIPAS gas is deposited on the surface of the silicon oxide film 40 of the wafer W, and a seed layer 50 is formed so as to coat the silicon oxide film 40.

Thereafter, supply of DIPAS gas is stopped and purge gas is supplied into the reactor tube 11 so as to purge the DIPAS gas from the inside of the reactor tube 11. Thereafter, $Si_2H_6$ gas is supplied into the reactor tube 11. This $Si_2H_6$ gas is deposited on the first seed layer, and the second seed layer is formed so as to cover the first seed layer. Thereafter, supply of the $Si_2H_6$ gas is stopped and purge gas is supplied into the reactor tube 11 so as to purge the $Si_2H_6$ gas from the inside of the reactor tube 11.

FIG. 4C is a drawing illustrating an example of a deposition step.

After the step for forming the seed layer, supply of the purge gas is stopped and $SiH_4$ gas is supplied into the reactor tube 11. As illustrated in FIG. 4B, the $SiH_4$ gas is deposited on the second seed layer, and the amorphous silicon film 60 is formed over the entire top surface of the wafer W so as to cover the second seed layer. Then, the deposition of the $SiH_4$ gas is continued, and the amorphous silicon film 60 is grown. Specifically, the film thickness of the amorphous silicon film 60 increases, and the amorphous silicon film 60 functions as an amorphous silicon bulk layer.

For example, the amorphous silicon film 60 is formed in a range of 440 to 530° C. in a case where the $SiH_4$ gas is used as the deposition gas.

Instead of the $SiH_2$ gas, $Si_2H_6$ gas may be used. In this case, the step for forming the seed layer to the deposition step may be performed continuously. Even in a case where the $Si_2H_6$ gas is used as the deposition gas, the amorphous silicon film 60 is formed in a range of 440 to 530° C.

In the deposition step, the amorphous silicon film 60 is formed on the seed layer 50 formed above the top surface of the wafer W.

After the $SiH_4$ gas supply or $Si_2H_6$ gas supply is stopped, a purge gas is supplied into the reactor tube 11, and $SiH_4$ gas or $Si_2H_6$ gas is purged from the reactor tube 11.

FIG. 4D is a drawing illustrating an example of a step for forming a high-temperature amorphous silicon film. As illustrated in FIG. 4D, in the step for forming the high-temperature amorphous silicon film, an amorphous silicon film is deposited in a high-temperature range. The high-temperature range is in a temperature range that is equal to or more than 550° C. and that is less than 600° C., and preferably in a temperature range that is equal to or more than 560° C. and that is equal to or less than 580° C.

When the amorphous silicon film 65 is formed in such a high-temperature range, the amorphous silicon film 65 including crystal nuclei formed by causing migration in the amorphous silicon film 65 can be deposited.

The temperature setting for the deposition step and the step for forming the high-temperature amorphous silicon film may be set by controlling the heater 19 with the controller 30.

Although not illustrated, when the amorphous silicon films 60 and 65 are thereafter annealed in a temperature range that is equal to or more than 600° C. and that is less than 700° C., crystal growth from the crystal nuclei of the high-temperature amorphous silicon film 65 can be promoted, and the high-temperature amorphous silicon film 65 and the amorphous silicon film 60 can be crystallized.

The wafer W may be annealed in a vertical thermal process furnace, or the wafer W may be annealed upon being conveyed to an anneal apparatus provided externally.

FIGS. 5A to 5D are drawings illustrating an example of a method of crystallizing an amorphous silicon film according to a second embodiment of the present disclosure.

Figure 5:
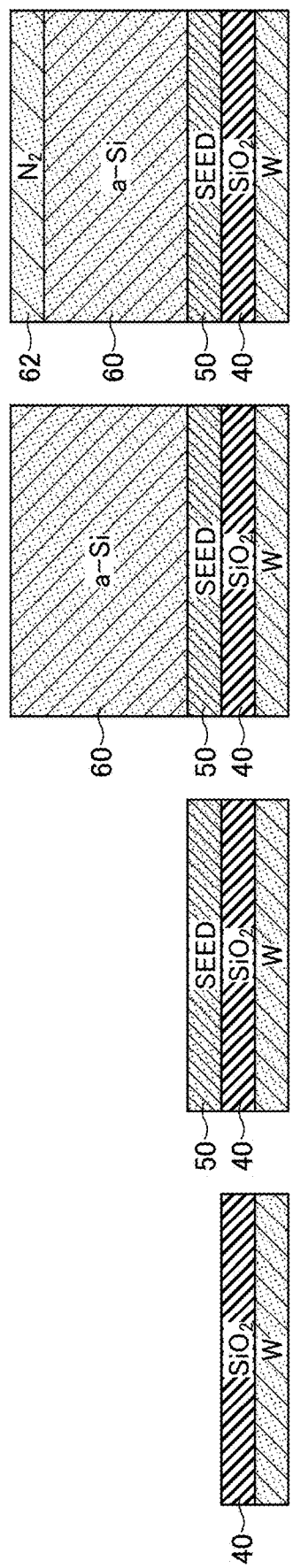
FIGS. 5A to 5D are drawings illustrating an example of a method of crystallizing an amorphous silicon film according to a second embodiment of the present disclosure.

FIG. 5A is a drawing illustrating an example of a wafer introduction step, which is substantially the same as the step of FIG. 4A, and therefore, description thereabout is omitted.

FIG. 5B is a drawing illustrating an example of a seed layer forming step. FIG. 5B is substantially the same as the step of FIG. 4B, and therefore, description thereabout is omitted.

FIG. 5C is a drawing illustrating an example of a deposition step. FIG. 5C is substantially the same as the step of FIG. 4C, and therefore, description thereabout is omitted.

FIG. 5D is a drawing illustrating an example of a heat load application step. In the heat load application step, a heat load is applied to the outer layer of the amorphous silicon film 60 formed in the deposition step. Specifically, inert gas such as nitrogen is supplied to the outer layer of the amorphous silicon film 60. Similar to the step for forming the high-temperature amorphous silicon film of FIG. 4D, the temperature is set to a high-temperature range, and is in a temperature range that is equal to or more than 550° C. and that is less than 600° C. Preferably, the temperature is set to a temperature range that is equal to or more than 560° C. and that is equal to or less than 580° C.

Although silane gas is not supplied, the temperature is set to the high-temperature range similar to the temperature range of the step for forming the high-temperature amorphous silane film, so that migration occurs in the outer layer of the amorphous silicon film 60 to form the crystal nuclei 61. Specifically, the high-temperature amorphous silicon film 62 is formed. Although the crystal nuclei generated at this occasion is often smaller in number than the crystal nuclei generated in the step for forming the high-temperature amorphous silane film illustrated in FIG. 4D, the crystal nuclei are formed in the outer layer, and therefore, by thereafter performing annealing, crystallization can be caused from the outer layer.

In this manner, when the amorphous silicon film 60 is exposed to the atmosphere of inert gas to be heated, the crystal nucleus can be formed in the outer layer of the amorphous silicon film and crystallization can be made from the outer layer.

Thereafter, similar to the first embodiment, annealing may be performed.

Furthermore, similar to the first embodiment, the temperature setting may be set by controlling the heater 19 with the controller 30.

Next, a method of crystallizing an amorphous silicon film according to the third embodiment is explained. In the first and second embodiment, according to the step for forming the high-temperature amorphous silicon film, silicon migration causes the formation of the crystal nuclei 61 in the outer layer of the amorphous silicon film 60.

In the third embodiment, the inside of the reactor tube 11 is evacuated at a high temperature, and silicon migration causes the formation of the crystal nuclei 61 in the outer layer of the amorphous silicon film 60. Specifically, hydrogen is desorbed from the outer layer of the amorphous silicon film by vacuum evacuation, and a film with a low hydrogen concentration is formed, so that migration causes the formation of the crystal nucleus 61. In this manner, the crystal nuclei 61 may be generated in the outer layer of the amorphous silicon film 60 not only by supplying silane gas or nitrogen gas but also by evacuating the inside of the reactor tube 11.

EXAMPLE

Figure 6:
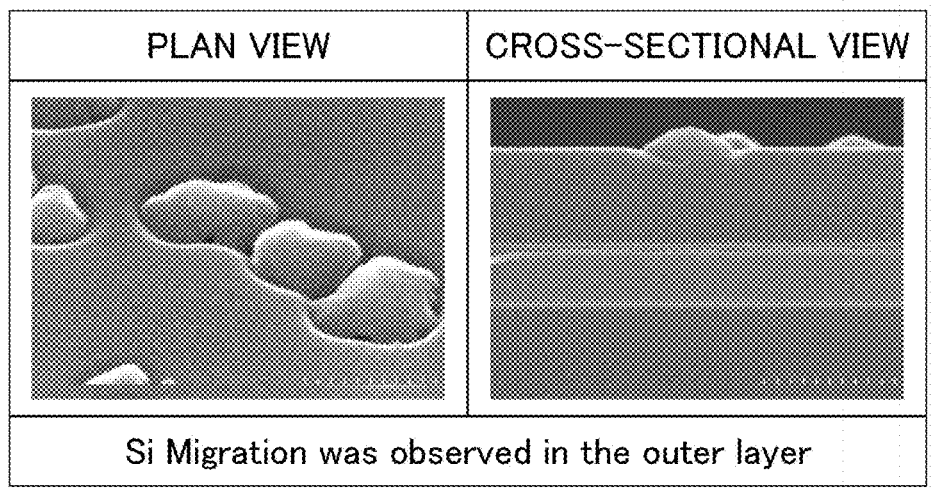
FIG. 6 is a figure illustrating an example in which the method of crystallizing the amorphous silicon film according to the embodiment of the present disclosure is implemented by the deposition apparatus according to the present embodiment.

FIG. 6 is a figure illustrating an example in which the method of crystallizing the amorphous silicon film according to the embodiment of the present disclosure is implemented by the deposition apparatus according to the present embodiment.

As illustrated in FIG. 6, when the method of crystallizing the amorphous silicon film according to the present embodiment was performed, silicon migration was observed in the outer layer. This example is a result obtained by carrying out the crystallization method of the amorphous silicon film according to the first embodiment.

The temperature in the deposition step was equal to or more than 450° C. and equal to or less than 500° C., and the step for forming the high-temperature amorphous silicon film was performed at a temperature that is equal to or more than 560° C. and equal to or less than 580° C.

In this manner, when crystal nuclei were formed in the top surface, crystallization is advanced from the outer layer to the bottom portion during annealing, and the entirety of the amorphous silicon film 60 can be crystallized.

Figure 7:
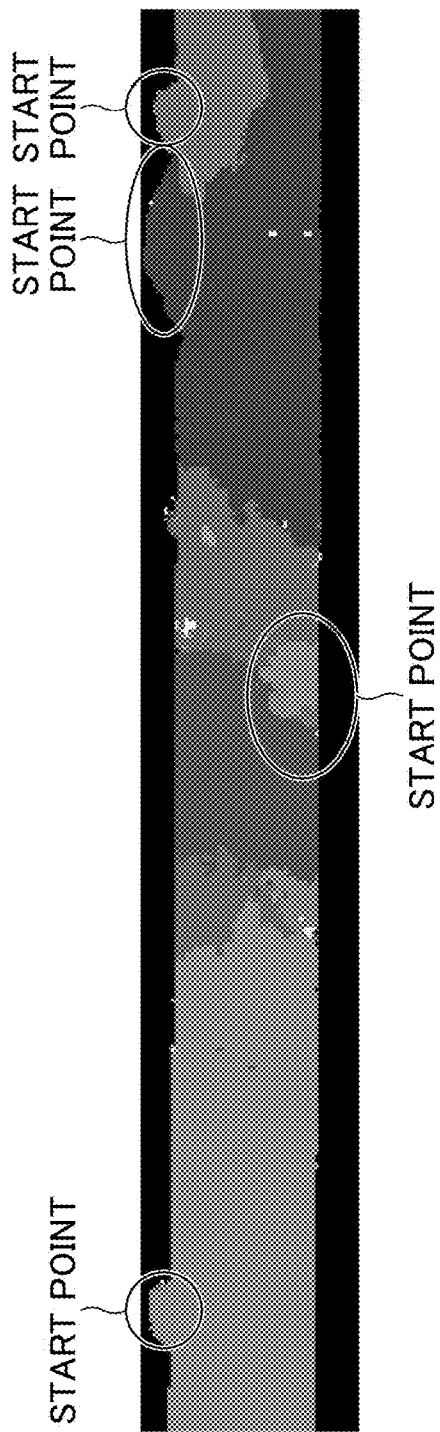
FIG. 7 is a figure illustrating start points of crystallization in the example.

FIG. 7 is a figure illustrating start points of crystallization in the example. As illustrated in FIG. 7, most of the start points are in the outer layer.

Figure 8:
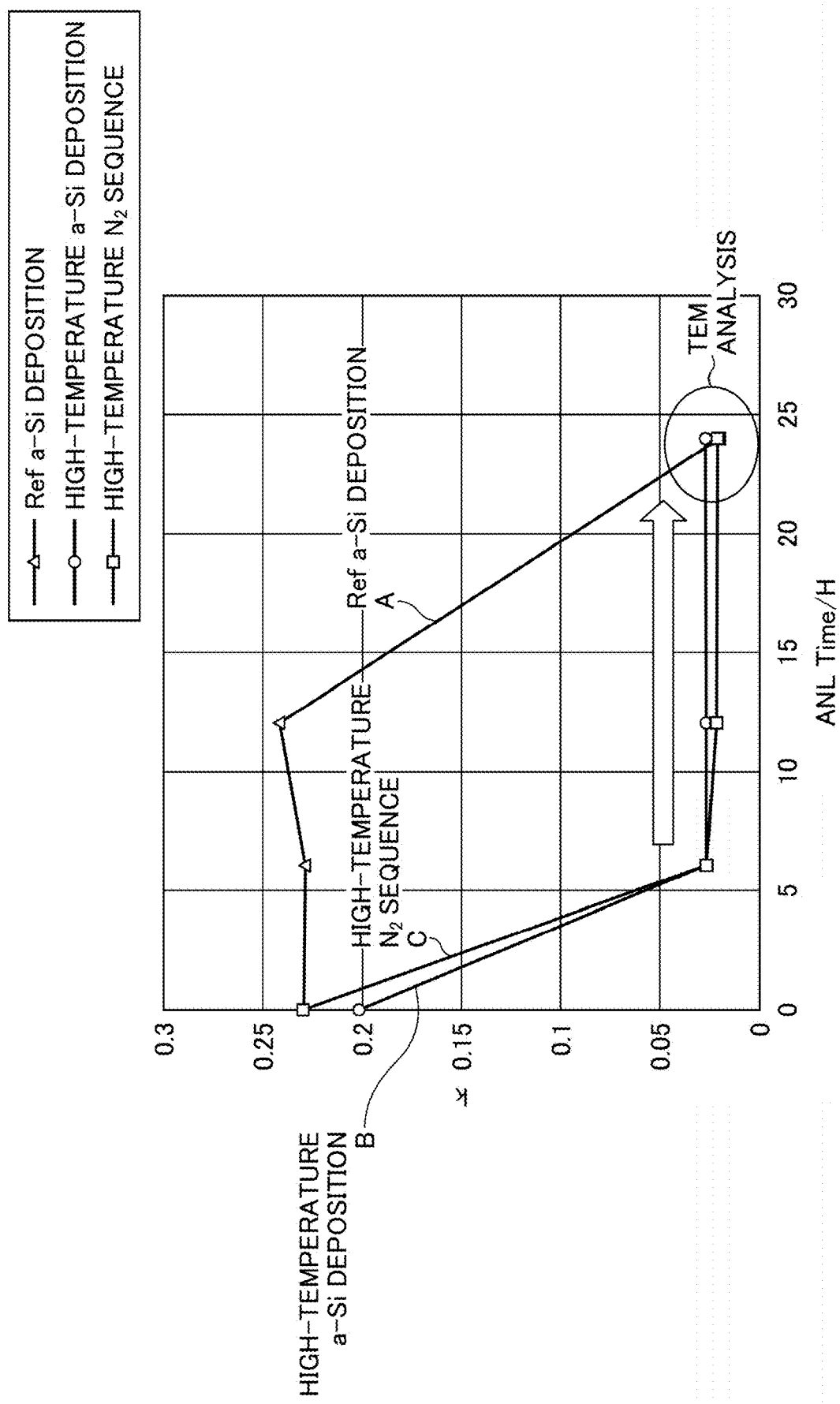
FIG. 8 is a graph illustrating an evaluation result of a crystallization temperature of a method of crystallizing an amorphous silicon film according to the example.

FIG. 8 is a graph illustrating an evaluation result of a crystallization temperature of a method of crystallizing an amorphous silicon film according to the example. FIG. 8 illustrates an example for comparing a crystallization temperature where an amorphous silicon film deposited by a conventional deposition method was annealed at 580° C., a crystallization temperature where the method of crystallizing the amorphous silicon film according to the first embodiment was performed, and a crystallization temperature where the method of crystallizing the amorphous silicon film according to the second embodiment was performed. In FIG. 8, the horizontal axis denotes an anneal time, and the vertical axis denotes a k value. The k value was a value indicating the degree of crystallization. In a case of silicon, when the k value is equal to or less than 0.05, this indicates an occurrence of crystallization.

In FIG. 8, the property A indicates a crystallization time property obtained when an amorphous silicon film was deposited at a temperature that is equal to or more than 450° C. and equal to or less than 500° C. and was thereafter annealed at a temperature of 580° C. The property B indicates a crystallization time property obtained when an amorphous silicon film was deposited at a temperature that is equal to or more than 450° C. and equal to or less than 500° C. and thereafter an amorphous silicon film was deposited for capping at a temperature that is equal to or more than 560° C. and equal to or less than 580° C. The property C indicates a crystallization time property obtained when an amorphous silicon film was deposited at a temperature that is equal to or more than 450° C. and equal to or less than 500° C. and was thereafter exposed to nitrogen gas at a temperature that is equal to or more than 560° C. and equal to or less than 580° C.

As illustrated in FIG. 8, with the properties B and C according to this example, crystallization was completed in about six hours. In contrast, with the property A according to a comparative example, it took 24 hours to complete the crystallization. Specifically, with the properties B and C according to this example, crystallization was completed in a time that is about 18 hours shorter than with the property A according to the comparative example.

There was no great difference between the property B and the property C. In both of the property B and the property C, the crystallization was completed very quickly, but with the property B, the incubation time for forming the crystal nuclei was shorter, and the property B exhibited the better result than the property C.

In this manner, it was found that, as compared with the conventional method of crystallizing the amorphous silicon film according to the comparative example, the method of crystallizing the amorphous silicon film according to this example can complete crystallization in a very short time.

Figure 9:
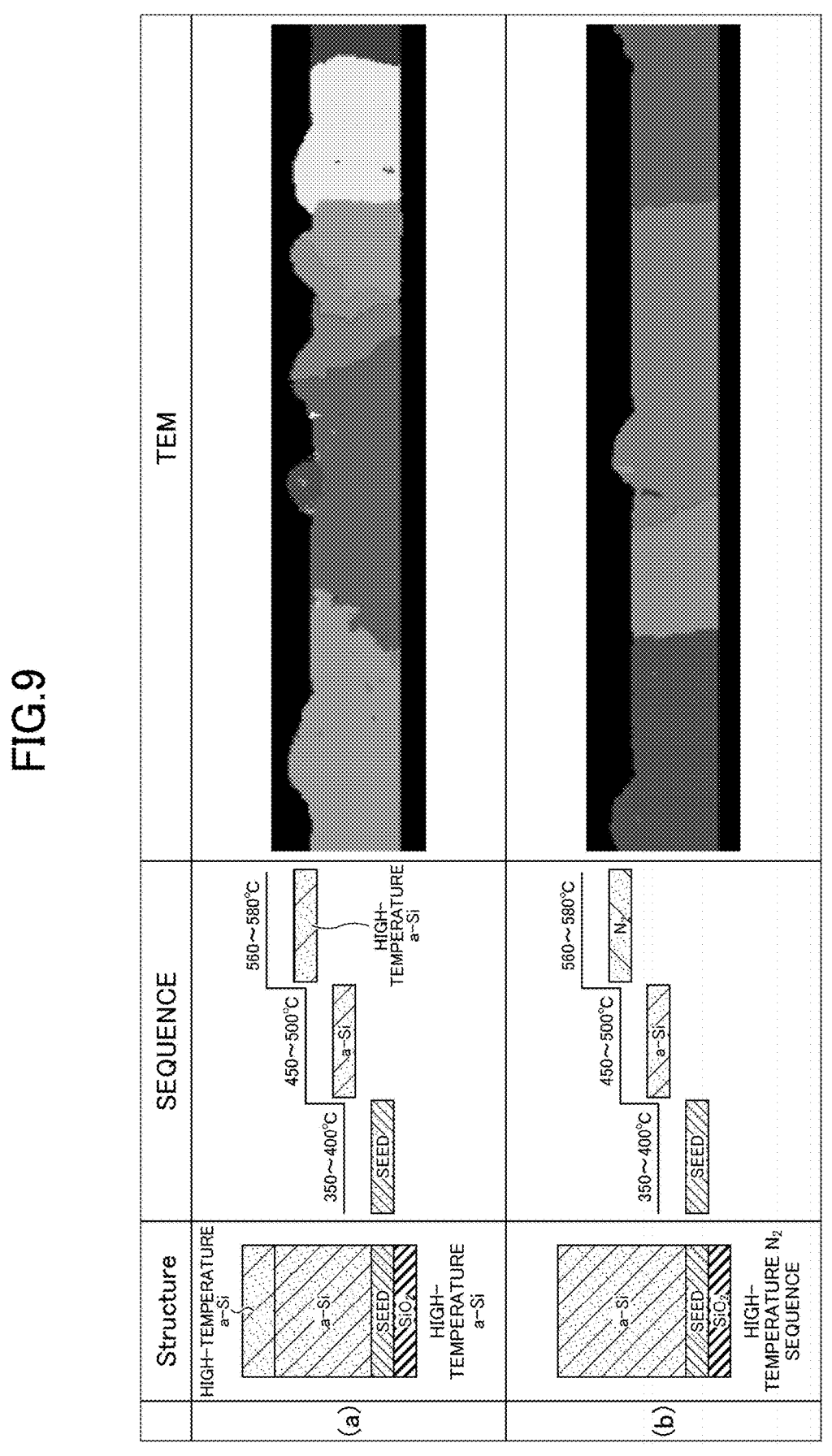

FIG. 9 is a figure for comparing cross-sectional structures of the example according to the property B and the example according to the property C illustrated in FIG. 8. In FIG. 9, (a) corresponds to the example according to the property B, in which an amorphous silicon film was formed at a temperature that is equal to or more than 450° C. and equal to or less than 500° C. and thereafter an amorphous silicon film was deposited that is equal to or more than 560° C. and equal to or less than 580° C. In FIG. 9, (b) corresponds to the example according to the property C, in which an amorphous silicon film was formed at a temperature that is equal to or more than 450° C. and equal to or less than 500° C. and was thereafter exposed to nitrogen atmosphere at a temperature that is equal to or more than 560° C. and equal to or less than 580° C. With regard to the cross-sectional structure taken with a transmission electron microscopy (TEM), crystal nuclei were formed in the outer layer in both of (a) and (b). In the example according to the property B of (a), a larger number of crystal nuclei were formed, and the chance of silicon migration was high.

However, it was found that, in both of (a) and (b), preferable cross-sectional structures were obtained, and crystallization from the outer layer was achieved.

FIG. 10 is a figure illustrating an implementation result of the example according to the property B with a change in temperature in the step for forming a high-temperature amorphous silicon film.

In FIG. 10, (a) is an example in which the step for forming the high-temperature amorphous silicon film was performed at a temperature of 550° C., (b) is an example in which the step was performed at a temperature of 560° C., (c) is an example in which the step was performed at a temperature of 570° C., and (d) is an example in which the step was performed at a temperature of 580° C.

In the case of (a) of FIG. 10, silicon migration did not occur. In the cases of (b) to (d) of FIG. 10, silicon migration occurred. The number of silicon migrations increased with increasing temperature to 560° C., 570° C., and 580° C. In this manner, it was found that, in a case where the step for forming the high-temperature amorphous silicon film is performed with monosilane, the temperature is preferably set to a temperature range of 560° C. to 580° C.

The step for forming the high-temperature amorphous silicon film can be performed with various types of silane gas such as disilane and trisilane, and the temperature of 560° C. to 580° C. is not always the optimum temperature range for all of the silanes, and the step is not to be necessarily performed in this temperature range.

As explained above, according to the method of crystallizing the amorphous silicon film and the deposition apparatus of the present embodiment, crystal nuclei are formed by causing silicon migration on the outer layer side, and crystallization can be advanced from the outer layer side to the bottom surface side.

According to the present disclosure, crystallization can be performed from the outer layer of the amorphous silicon film.

Although preferred embodiments and examples of the present disclosure have been explained in detail, the present disclosure is not limited by the above-described embodiments and examples, and various modifications and replacements can be applied to the above-described embodiments and examples without departing from the subject matter described in the claims.

All examples recited herein are intended for pedagogical purposes to aid the reader in understanding the disclosure and the concepts contributed by the inventor to furthering the art, and are to be construed as being without limitation to such specifically recited examples and conditions, nor does the organization of such examples in the specification relate to a showing of the superiority or inferiority of the disclosure. Although the embodiments of the present disclosure have been described in detail, it should be understood that various changes, substitutions, and alterations could be made hereto without departing from the spirit and scope of the disclosure.

What is claimed is:

1. A method of crystallizing an amorphous silicon film, comprising:
    depositing the amorphous silicon film on a seed layer formed over a substrate while heating the amorphous silicon film to a first temperature;
    forming a crystal nucleus in an outer layer of the amorphous silicon film by causing migration of silicon in the outer layer by heating the amorphous silicon film to a second temperature higher than the first temperature; and
    after forming the crystal nucleus, annealing the amorphous silicon film at a third temperature higher than the second temperature, wherein
    in the annealing, the crystal nucleus is grown from the outer layer to a bottom surface side.

2. The method of crystallizing the amorphous silicon film according to claim 1, wherein the forming of the crystal nucleus comprises forming the crystal nucleus while supplying inert gas to the amorphous silicon film.

3. The method of crystallizing the amorphous silicon film according to claim 2, wherein the inert gas is nitrogen gas.

4. The method of crystallizing the amorphous silicon film according to claim 1, wherein the forming of the crystal nucleus comprises forming the crystal nucleus while depositing a second amorphous silicon film on the amorphous silicon film.

5. The method of crystallizing the amorphous silicon film according to claim 1, wherein the amorphous silicon film is formed by supplying silane gas onto the seed layer.

6. The method of crystallizing the amorphous silicon film according to claim 5, wherein the silane gas is monosilane or disilane.

7. The method of crystallizing the amorphous silicon film according to claim 1, wherein the first temperature is in a range between 440° C., inclusive, and 530° ° C., exclusive, and the second temperature is in a range between 550° C., inclusive, and 600° ° C., exclusive.

8. The method of crystallizing the amorphous silicon film according to claim 7, wherein the forming of the crystal nucleus comprises forming the crystal nucleus at a temperature between 560° ° C., inclusive, and 580° ° C., inclusive.

9. The method of crystallizing the amorphous silicon film according to claim 1, wherein the forming of the crystal nucleus comprises forming the crystal nucleus while evacuating a process chamber in which the substrate is accommodated.

10. The method of crystallizing the amorphous silicon film according to claim 1, further comprising, before forming the amorphous silicon film, forming the seed layer constituted by silicon over the substrate.

11. The method of crystallizing the amorphous silicon film according to claim 1, wherein the third temperature is a temperature equal to or more than 650° C. and equal to or less than 750° C.

* * * * *